(12) United States Patent
Ruething et al.

(10) Patent No.: US 7,557,386 B2
(45) Date of Patent: Jul. 7, 2009

(54) REVERSE CONDUCTING IGBT WITH VERTICAL CARRIER LIFETIME ADJUSTMENT

(75) Inventors: Holger Ruething, Munich (DE); Hans-Joachim Schulze, Ottobrunn (DE); Franz-Josef Niedernostheide, Muenster (DE); Frank Hille, Munich (DE)

(73) Assignee: Infineon Technologies Austria AG, Villach (AT)

( * ) Notice: Subject to any disclaimer, the term of this patent is extended or adjusted under 35 U.S.C. 154(b) by 458 days.

(21) Appl. No.: 11/393,542

(22) Filed: Mar. 30, 2006

(65) Prior Publication Data

US 2007/0231973 A1  Oct. 4, 2007

(51) Int. Cl.
H01L 29/00 (2006.01)
H01L 31/00 (2006.01)

(52) U.S. Cl. .................... 257/146; 257/140; 257/330; 257/337; 257/341

(58) Field of Classification Search ............... 257/140, 257/146, 330, 337, 341
See application file for complete search history.

(56) References Cited

U.S. PATENT DOCUMENTS

| | | | |
|---|---|---|---|
| 5,160,985 A | 11/1992 | Akiyama | 257/145 |
| 6,323,509 B1 | 11/2001 | Kusunoki | 257/146 |
| 6,838,321 B2 | 1/2005 | Kaneda et al. | 438/133 |
| 7,112,868 B2 * | 9/2006 | Willmeroth et al. | 257/578 |
| 7,126,186 B2 * | 10/2006 | Weber et al. | 257/327 |
| 2004/0063302 A1 | 4/2004 | Takahashi et al. | 438/542 |
| 2005/0258493 A1 | 11/2005 | Aono et al. | 257/370 |
| 2005/0280076 A1 * | 12/2005 | Barthelmess et al. | 257/327 |
| 2006/0043475 A1 | 3/2006 | Terashima | 257/335 |
| 2006/0138533 A1 * | 6/2006 | Hirler et al. | 257/330 |
| 2006/0267091 A1 * | 11/2006 | Takahashi | 257/341 |
| 2008/0121993 A1 * | 5/2008 | Hefner et al. | 257/341 |

FOREIGN PATENT DOCUMENTS

DE 103 44 827 A1 5/2005
DE 10 2005 018 366 11/2005

* cited by examiner

*Primary Examiner*—Fernando L Toledo
(74) *Attorney, Agent, or Firm*—Davidson, Davidson & Kappel, LLC

(57) ABSTRACT

A reverse conducting insulated gate bipolar transistor (IGBT) includes a semiconductor substrate having a front side and a back side and a first conductivity region between the front and back sides. The first conductivity region includes a reduced lifetime zone, a first lifetime zone between the reduced lifetime zone and the front side, and an intermediate lifetime zone between the reduced lifetime zone and the back side. Charge carriers in the first lifetime zone have a first carrier lifetime, charge carriers in the reduced lifetime zone have a reduced carrier lifetime shorter than the first carrier lifetime, and charge carriers in the intermediate lifetime zone have an intermediate carrier lifetime shorter than the first carrier lifetime and longer than the reduced carrier lifetime.

14 Claims, 4 Drawing Sheets

REVERSE CONDUCTING IGBT WITH VERTICAL CARRIER LIFETIME ADJUSTMENT

BACKGROUND OF THE INVENTION

The present invention relates to a reverse conducting insulated gate bipolar transistor (IGBT) and a method of manufacturing the same.

Conventional IGBTs are used, for example, in inverter circuits to regulate a load such as an electric motor. An example of such a conventional IGBT is described in U.S. Pat. No. 5,160,985, which is incorporated by reference herein. Conventional inverter circuits include conventional IGBTs, each connected in parallel to a free-wheeling diode to allow for current circulation, since a conventional IGBT has no bi-directional current flow capability.

U.S. Patent Application No. 2005/0258493, which is incorporated by reference herein, describes a reverse conducting IGBT, in which an IGBT and a free wheeling diode are monolithically formed on a substrate. The reverse conducting IGBT includes a conductive type base layer formed in the substrate and a short lifetime region formed in the conductive base layer. An emitter electrode and a gate electrode are formed on a front side of the substrate and a collector electrode is formed on the back side of the substrate. The short lifetime region is formed in the conductive base layer by irradiating the substrate with an electron or helium beam from the front side of the substrate.

U.S. Pat. No. 6,323,509 and U.S. Patent Application No. 2006/0043475, both of which are incorporated by reference herein, describe various reverse conducting IGBTs having integrated diodes.

BRIEF SUMMARY OF THE INVENTION

An object of the present invention is to provide a reverse conducting IGBT having improved voltage drop characteristics in the on-state of the IGBT on the one-hand, and a soft turn-off behavior at low switching losses of the integrated diode on the other hand. A further or alternate object of the present invention is to provide a reverse conducting IGBT with improved switch-off ruggedness of the integrated diode due to decreased charge carrier concentration in an edge termination system of the die.

The present invention provides a reverse conducting IGBT that includes:

a substrate including a semiconductor material having a front side and a back side and a first conductivity region between the front and back sides;

an emitter electrode disposed at the front side of the substrate;

a gate electrode disposed on the front side of the substrate; and a collector electrode disposed on the back side of the substrate, wherein the first conductivity region includes a reduced lifetime zone, a first lifetime zone between the reduced lifetime zone and the front side, and an intermediate lifetime zone between the reduced lifetime zone and the back side, and wherein charge carriers in the first lifetime zone have a first carrier lifetime, charge carriers in the reduced lifetime zone have a reduced carrier lifetime shorter than the first carrier lifetime, and wherein charge carriers in the intermediate lifetime zone have an intermediate carrier lifetime shorter than the first carrier lifetime and longer than the reduced carrier lifetime.

By providing a reduced lifetime zone and an intermediate lifetime zone between the reduced lifetime zone and the back side of the substrate, the concentration of charge carriers in the base layer is advantageously reduced in the diode mode of the reverse conducting IGBT while providing effective conductivity and low voltage drop in the switching mode of the IGBT.

The present invention also includes a method for manufacturing reverse conducting IGBT that includes providing a substrate of a semiconductor material having a front side and a back side and wherein the semiconductor material is doped so as to include an n-doped region, a p-doped region and a p-n junction disposed between the n-doped region and the p-doped region. An emitter electrode and a gate electrode are provided at the front side, and a collector electrode is provided at the back side. The substrate is irradiated from the back side with defect-causing particles so as to form a reduced carrier lifetime zone in the n-doped region at a distance behind the p-n junction.

By irradiating the substrate from the back side with defect causing particles, damage to the gate isolating layer is avoided, since the particles do not reach this layer. Irradiating the gate isolating area with positively charged ions can impair the functioning of the IGBT, for example, by creating a positive charge in the gate isolating layer and therefore causing an unacceptable shift of the threshold voltage, a drift of the threshold voltage under operating conditions, or a high gate leakage current.

In addition, irradiating from the back side causes a first reduced lifetime region at a region where the defect-causing particles are stopped in the substrate, and a second reduced lifetime region between the back side and the first reduced lifetime region, in which the charge carrier lifetime is slightly reduced, thus providing a carrier lifetime profile which is advantageous in diode mode of the reverse conducting IGBT device. Furthermore the base region between the reduced lifetime region and the pn-junction (of the base region and the p-body of the IGBT or the p-emitter of the diode, respectively) exhibits a carrier lifetime which is desirable for low on-state losses of the IGBT.

BRIEF DESCRIPTION OF THE SEVERAL VIEWS OF THE DRAWINGS

The present invention will be further described with reference to several preferred embodiments, in which.

DETAILED DESCRIPTION OF THE INVENTION

Figure 1:
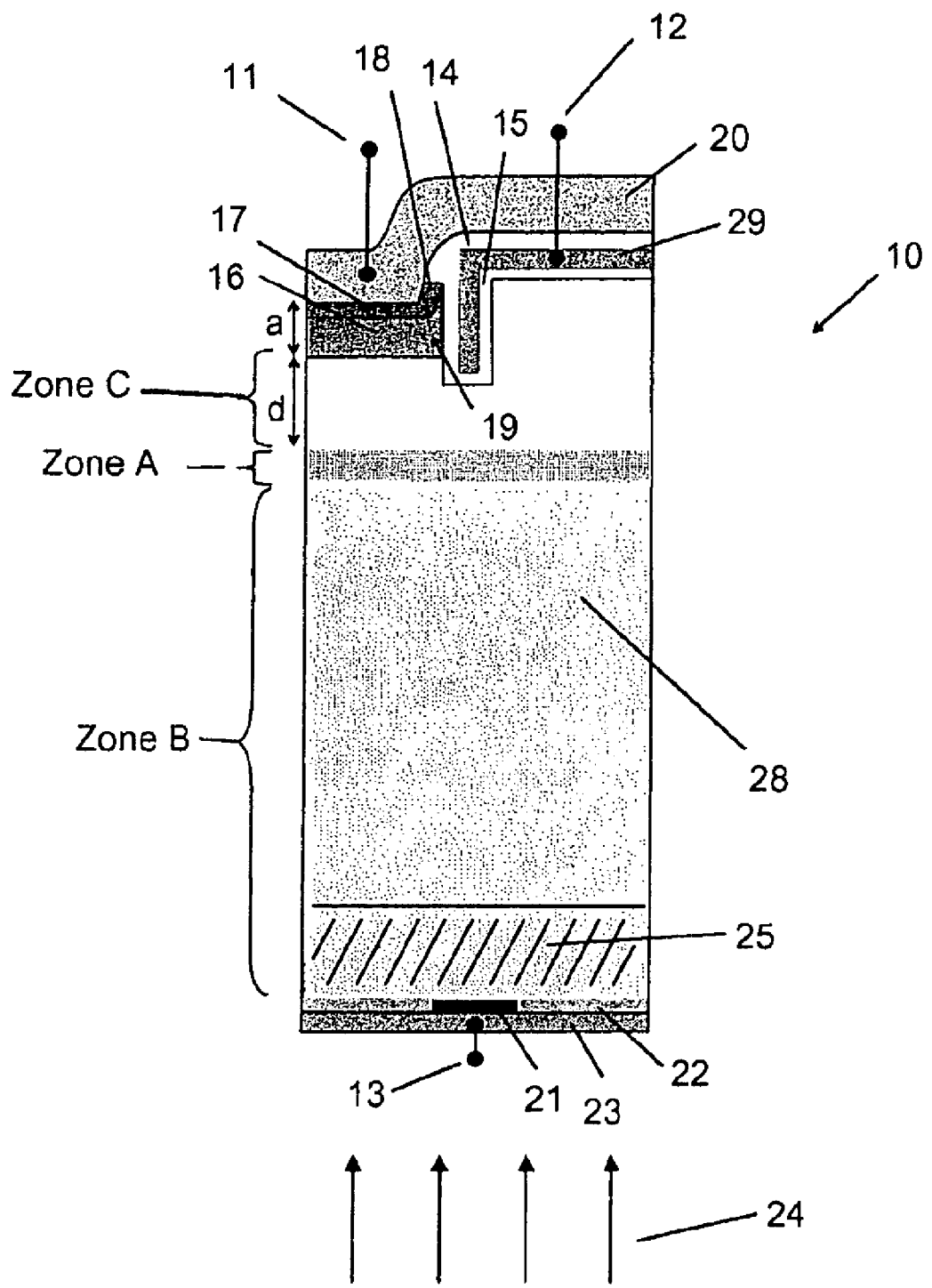
FIG. 1 shows schematically a portion of a single cell of a first embodiment of a reverse conducting IGBT according to the present invention.

FIG. 1 shows schematically a portion of a first embodiment of a reverse conducting IGBT 10 that includes a front metallization layer 20 at the front (top of the drawing), a back metallization layer 23 at the back (bottom of the drawing) and a substrate of a semiconductor material therebetween. The semiconductor substrate material is doped so as to include different conductivity regions, including 16 (p-doped), 17 (p+-doped), 18 (n+-doped), 28 (n-doped), 21 (n+-doped), and 22 (p-doped), which are described in more detailed below.

At the back side of the IGBT 10 (bottom of the drawing) a highly doped n region (n+ region 21) is connected to metallization layer 23 to which collector electrode 13 is connected. The n+ region can extend laterally so as to be smaller than the lateral extensions of a single cell as shown in FIG. 1, but it can also extend laterally to encompass several cells, as shown, for example, in FIG. 4. The n+ region 21 can have any desired shape when viewed from the back of the IGBT 10, such as round, square, polygonal, etc. The n+ region 21 is surrounded laterally by, or is adjacent to, a p-doped region 22, which also contacts the metallization layer 23. Though only one n+ region is shown in FIG. 1, there can be any number of n+ regions forming any shape or pattern. Both the n+ region 21 and the p region 22 are in contact with the n-doped region 28, which extends throughout the zones labeled Zone B, Zone A and Zone C, which are discussed further below.

At the front side of the IGBT (top of the drawing), an emitter electrode 11 is connected to metallization layer 20, and a gate electrode 12 is connected to a conductive gate layer 29 that is electrically insulated from the emitter electrode 11 via an insulating layer (i.e. oxide) 14 and from the semiconductor material via an insulating layer (i.e. oxide) 14 and an insulating layer (i.e. oxide) 15, which may be of the same or different material. The front region of the semiconductor substrate includes a highly doped p region (p+ region 17) in contact with the front metallization layer 20 at its front edge and in contact with a p-doped region 16 at its back edge. Alternatively, a single p-doped region 16 could extend to contact the front metallization layer. The p+ region 17 is typically provided in addition to the p region 16 so as to inhibit latch-up of the device during turn-off, and is therefore sometimes referred to as a non-latch conductivity region. Both p-doped regions 16 and 17 are shown in FIG. 1 as having a total thickness a. A small, highly doped n region (n+ region 18) is provided next to the non-latch region 17 and in contact with both the metallization layer 20 and the p region 16.

When a negative voltage drop is applied across the emitter and collector electrodes (e.g. negative voltage at the emitter and positive voltage at the collector) and the gate electrode is at a neutral or negative voltage with respect to the emitter electrode, no current (except for a small leakage current) will flow through the IGBT device. The paucity of free electrons in the p-doped region 16 will prevent the flow of charge carriers (electrons and holes) through the p-region 16. Thus, under these conditions, the IGBT is in a switched-off mode.

However, when a positive voltage higher than the threshold voltage (depending on the doping concentration of the p-region 16) is applied at the gate electrode, enough electrons in the p-region 16 are attracted to the right side of the region so as to form an inversion channel 19, through which electrons flow from the n+ region 18 to the n region 28. Thus, current flows from the collector electrode 13 to the emitter electrode 11 (through the metallization layer 23, p-region 22, n-region 28, and through the inversion channel 19 of the p-region 16, to the n+ region 18 to metallization layer 20) as well as through the p-region 16 and the p+ region 17. The electrons (negative charge carriers) flow in the opposite direction as the current and the holes (positive charge carriers) flow in the same direction as the current. Thus, under these conditions, the IGBT is in a switched-on mode.

When the IGBT is in the switched-off mode, and the polarity at the collector and emitter electrodes are reversed (i.e. a negative voltage drop from the collector electrode to the emitter electrode), the reverse conducting IGBT acts as a forward biased diode with the collector acting as the cathode and the emitter acting as the anode of the diode. In this state, the reverse conducting IGBT is said to be in diode mode. In diode mode, the reverse conducting IGBT allows current to flow in the reverse direction as in the on-state of the IGBT. Thus, in diode mode, current flows from the emitter/anode 11 through the p+ region 17 and p region 16 across to the n region 28 and through the n+ region 21 and metallization layer 23 to the collector/cathode 13. The electrons flow in the opposite direction from the collector/cathode 13 to the emitter/anode 11.

Effective functioning of the internal diode of the reverse conducting IGBT is effected by the concentration of charge carriers (electrons and holes) in the different areas of the substrate. In general, the higher the overall concentration of free charge carriers in the substrate, the higher the conductivity of the diode. In addition, a charge carrier concentration profile that includes a smaller concentration of charge carriers at the front/anode side, which gradually rises with increasing proximity to the back/cathode side, provides a favorable concentration profile for efficient functioning of the diode, i.e. in respect to turn-off losses and softness of the current decrease during turn-off.

The charge carriers have a limited lifetime, which ranges typically between 500 µs and 2 ms in defect-free silicon material and which is the average time required to recombine with a charge carrier of the opposite polarity (i.e. the average time for an electron to recombine with a hole). Reducing the lifetime of the charge carriers in certain regions of the semiconductor substrate in a reverse conducting IGBT reduces the overall concentration of charge carriers in the substrate. Furthermore, reducing the carrier lifetimes in specific zones can result in a more favorable carrier concentration profile of the reverse conducting IGBT in the diode mode as discussed with respect to FIG. 2 below.

The large n-doped conductivity region 28 spans zones C, A, and B, which represent three carrier lifetime zones. In Zone C, no treatment has been made to the conductivity region 28 of the substrate and the charge carriers will have their normal lifetime in Zone C. Zone A is a reduced carrier lifetime zone which is created, for example, by implanting defect-causing particles into the substrate by irradiation as discussed below. In the reduced carrier lifetime zone A, the carrier lifetime of the charge carriers (i.e. the average time to combine with a charge carrier of opposite polarity) is significantly reduced. Between zone A and the back metallization layer 23 is zone B, which is an intermediate carrier lifetime zone. In zone B, the carrier lifetime of the charge carriers is only slightly reduced as compared to the carrier lifetime in zone A, preferably by about 10%. The ratio of the carrier lifetime in zone A with respect to that in zone B is preferably in the range of 5% to 30%. The ratio of the carrier lifetime in zone A with respect to that in zone C is preferably in the range of lower than 0.5%.

The reduced carrier lifetimes zones A and B are created, for example, by irradiating the IGBT from the back side with defect causing particles, preferably protons or helium ions. The irradiation is preferably carried out after the top and bottom metallization layers 20, 23 and gate metallization layers have been applied. Because the irradiation is directed into the semiconductor substrate from the back side as shown by arrows 24 in FIG. 1, damage to the insulating layers 14 and 15 of the IGBT can be ruled out. An implantation energy of the protons or helium ions is selected to that the implanted particles penetrate the n-doped region 28 and are stopped in this region in the vicinity of the p-n junction formed by p-region 16 and n-region 28. The stopping range of the particles, shown by zone A in FIG. 1 alters the structure of the semiconductor material to create the reduced carrier lifetime zone. Preferably, the implantation energy is selected so that the front edge of zone A is a distance d from the back edge of the p-doped zone 16, such that $0.1a \leq d \leq 2a$. Typically, d will be between 1 μm to 10 μm. During the implantation from the rear, a second reduced carrier lifetime zone (intermediate carrier lifetime zone B) will automatically be created due to a small number of the protons or helium ions which stop in the semiconductor material before reaching the stopping range of zone A due to the statistical nature of nuclear stopping. Typically the carrier lifetime in the intermediate zone B will be nearly vertically homogeneous and will be 10 times higher than the carrier lifetime in zone A, but still be lower than the carrier lifetime in zone C. As discussed below, the intermediate zone B has a positive effect on the performance of the IGBT in diode mode.

In order to stabilize the distribution of recombination centers generated by the irradiation, it is recommended that a final heat treatment is carried out after the implantation step, preferably at temperatures that lie in a range of 220° C. to 350° C. (428° F. to 662° F.). The heat treatment is preferably performed for a few hours.

Creating zone A by irradiation from the back of the IGBT is preferably performed on a reverse conducting IGBT produced with thin wafers (e.g., <=about 150 μm), so that a suitable implantation energy can be selected to penetrate to a distance sufficiently close to the p-n junction near the front of the IGBT. The thicker the substrate material, the higher the implantation energy required to position the zone A near the p-n junction. Therefore the implementation of a field stop zone 25 close to region 22 is favorable to reduce the wafer thickness for a given blocking voltage.

Field stop zone 25 is a section of n-doped region 28, which is doped higher than the rest of region 28 and functions to stop the electric field in the presence of a blocking voltage and thus prevents penetration of the electric field into the p-region 22 on the back side of the substrate. The field stop zone 25 may abut against p-region 22 or may be spaced a slight distance from p-region 22.

Figure 2:
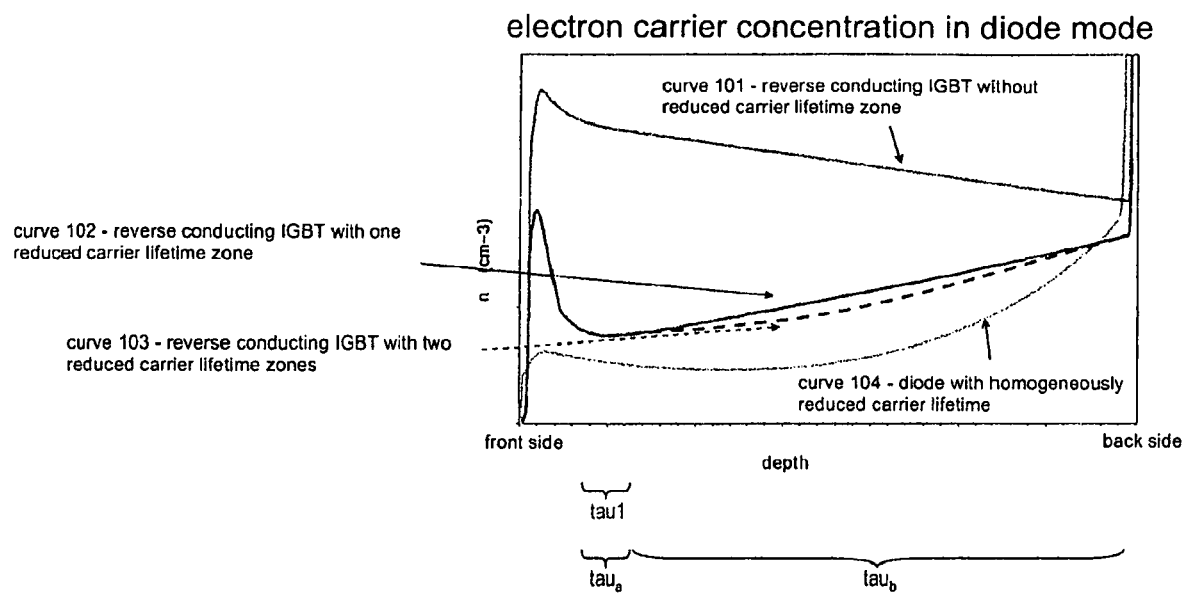
FIG. 2 shows a chart depicting the charge carrier concentration profiles of several IGBT devices operating in diode mode and a diode with vertically homogeneously reduced charge carrier lifetime.

FIG. 2 shows the charge concentration profiles of various IGBT devices in diode mode as compared with a standard thin wafer diode with vertically homogeneously reduced charge carrier lifetime. The bottom axis represents the depth from the front surface to the back surface, the axis at the left represents the concentration of charge carriers (electrons) per cubic centimeter. Curve 101 shows the concentration profile of charge carriers in a reverse conducting IGBT in diode mode without any lifetime reduction. Curve 104 shows the concentration profile of a diode with vertically homogeneously reduced charge carrier lifetime. Curve 102 shows the concentration profile of a reverse conducting IGBT with one reduced carrier lifetime zone, $tau_1$, such as the reverse conducting IGBT described in U.S. Patent Application No. 2005/0258493 discussed above. Curve 103 shows the concentration profile of a reverse conducting IGBT with two reduced carrier lifetime zones, $tau_a$ and $tau_b$, such as the device of FIG. 1. As shown in the table, curve 103 follows the same general path of curve 102 except as shown by the dashed line. In the region of $tau_b$ (corresponding to zone B in FIG. 1), there is a lower concentration of charge carriers as compared to curve 102. Thus, the additional reduced carrier lifetime zone (intermediate zone B) improves the performance of the reverse conducting IGBT in diode mode and better approximates the characteristics of a diode with vertically homogeneously reduced charge carrier lifetime (curve 104). Moreover, the additional intermediate zone B does not significantly effect the performance of the IGBT in the on state while the additional zone C, exhibiting a high carrier lifetime, even improves the on-state characteristics of the device, e.g. resulting in a lower forward voltage drop. Thus, the reverse conducting IGBT having two carrier lifetime reduction zones and a high carrier lifetime zone according to the present invention, allow a low voltage drop in the switched-on state, while at the same time, achieving low switching losses in the diode mode and exhibiting soft turn-off behavior.

Figure 3:
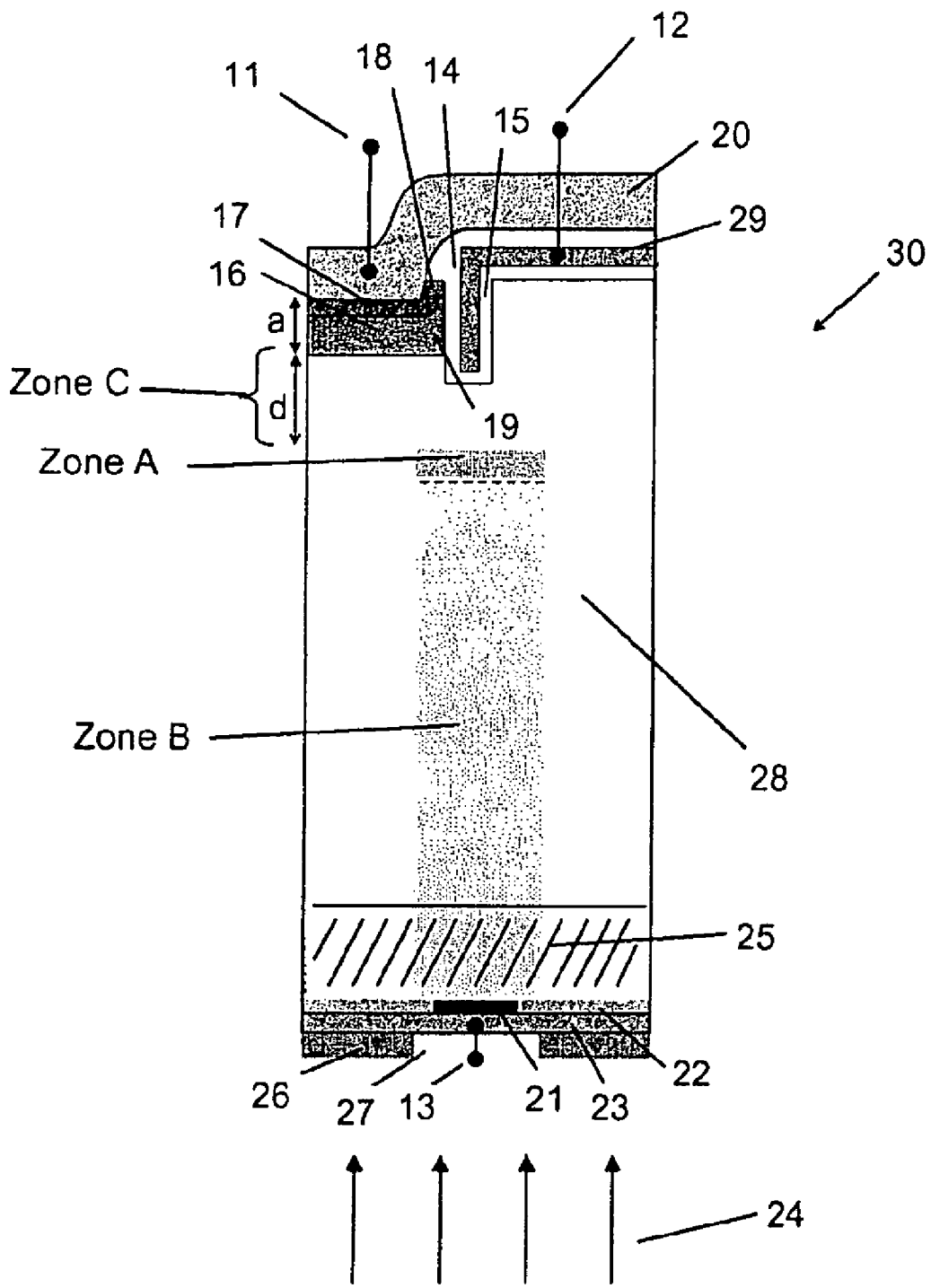
FIG. 3 shows schematically a portion of a second embodiment of a single cell of reverse conducting IGBT according to the present invention.

In another embodiment, shown in FIG. 3, the particle implantation is performed on a reverse conducting IGBT 30 with a mask 26 having a cutout 27. According to FIG. 3, a portion of the back of the IGBT is covered with mask 26 and the cutout 27 covers the area of the $n^+$ region 21, and preferably covers an area slightly larger than the n+ region 21. Thus, only the area of the n-base region 28 that is aligned with the cutout 27 is irradiated with the particles. Preferably, the irradiation area should be larger than the area of the n+ region 21 so as to overlap on each side at a distance that corresponds to between 1 and 3 times the diffusion length $L_D$ of the charge carriers in the n region 28.

The mask 26 is preferably made of a structured metal layer or a structured plate, and can be applied onto the back of the IGBT 30 as shown schematically in FIG. 3. Here, the thickness of the mask 26 should be selected in such a way that the implanted particles are stopped in the metal. Suitable materials for the mask include, for example, aluminum and copper.

Figure 4:
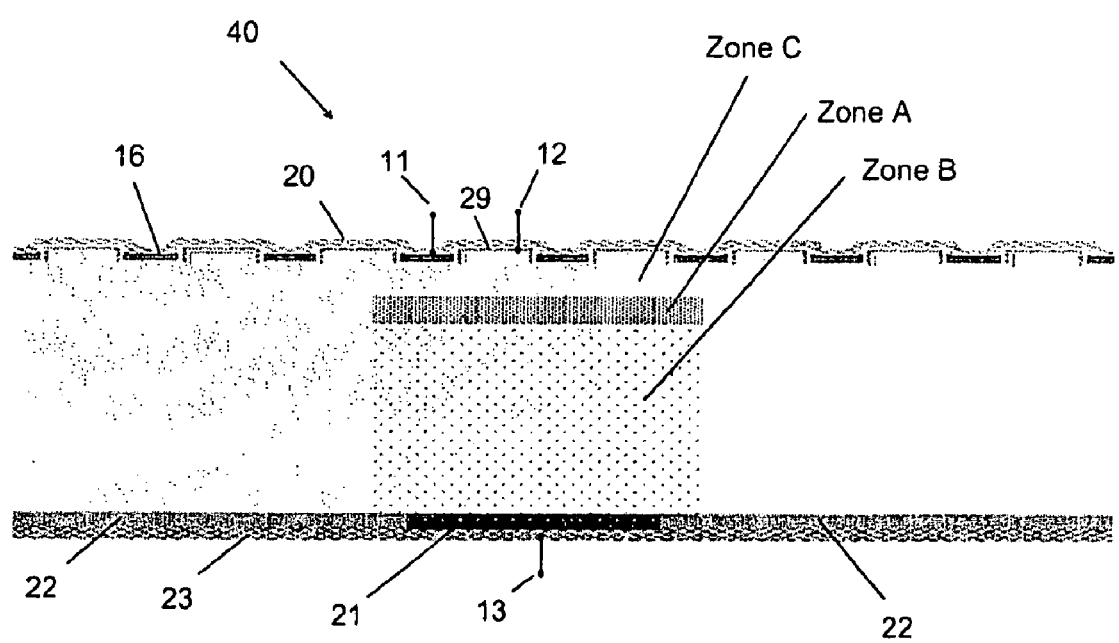
FIG. 4 shows schematically a portion of a third embodiment of a reverse conducting IGBT including several cells.

FIG. 4 shows a further preferred embodiment of a reverse conducting IGBT 40, in which the n+ region 21 is larger to cover several cells of a single IGBT. The n+ region 21 is wide enough to cover an area of the back metallization layer 23 corresponding to several gates 29. The n+ region 21 is surrounded laterally by, or adjacent to, a p-doped region 22. Preferably, the ratio of the area of the IGBT back covered by the p region 22 to the area covered by the n+ region 21 lies between 0.1 and 0.5.

The present invention has been described herein with reference to specific exemplary embodiments thereof. It will, however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A reverse conducting insulated gate bipolar transistor (IGBT) comprising:

a substrate including a semiconductor material having a front side and a back side and a first conductivity region between the front and back sides;

an emitter electrode disposed at the front side of the substrate;

a gate electrode disposed on the front side of the substrate; and a collector electrode disposed on the back side of the substrate, wherein the first conductivity region includes a reduced lifetime zone, a first lifetime zone between the reduced lifetime zone and the front side, and an intermediate lifetime zone between the reduced lifetime zone and the back side, and wherein charge carriers in the first lifetime zone have a first carrier lifetime, charge carriers in the reduced lifetime zone have a reduced carrier lifetime shorter than the first carrier lifetime, and wherein charge carriers in the intermediate lifetime zone have an intermediate carrier lifetime shorter than the first carrier lifetime and longer than the reduced carrier lifetime.

2. The reverse conducting IGBT as recited in claim 1, wherein the reduced carrier lifetime is approximately between 5% and 30% of the intermediate carrier lifetime.

3. The reverse conducting IGBT as recited in claim 1, wherein the reduced carrier lifetime is less than 0.5% of the first carrier lifetime.

4. The reverse conducting IGBT as recited in claim 1, wherein the semiconductor material includes a second conductivity region adjacent to the emitter electrode and having a thickness a, wherein a front edge of the reduced lifetime zone is disposed at a distance d from the second conductivity region, and wherein $0.1a<d<2a$.

5. The reverse conducting IGBT as recited in claim 1, wherein the first conductivity region is an n-doped region and the second conductivity region includes a p-doped region.

6. The reverse conducting IGBT as recited in claim 1, further comprising a front metallization layer on a front surface of the substrate in electrical contact with the emitter electrode, and a back metallization layer on the back side of the substrate in electrical contact with the collector electrode.

7. The reverse conducting IGBT as recited in claim 6, wherein the semiconductor material has a third conductivity region and a fourth conductivity region, each disposed adjacent to the back metallization layer and adjacent to each other.

8. The reverse conducting IGBT as recited in claim 7, wherein the third conductivity region is a p-doped region and the fourth conductivity region is a n+-doped region.

9. The reverse conducting IGBT as recited in claim 1, wherein the substrate has a thickness of less than 150 μm.

10. The reverse conducting IGBT as recited in claim 1, further comprising a plurality of further gate electrodes disposed at the first side of the substrate.

11. The reverse conducting IGBT as recited in claim 7, wherein the first conductivity region includes a field stop portion near the third and fourth conductivity regions having a higher conductivity than the rest of the first conductivity region.

12. The reverse conducting IGBT as recited in claim 11, wherein the field stop portion is adjacent to the third and fourth conductivity regions.

13. The reverse conducting IGBT as recited in claim 11, wherein the field stop portion separated by a distance from the third and fourth conductivity regions.

14. The reverse conducting IGBT as recited in claim 1, wherein the carrier lifetime in the first lifetime zone is between 500 μs and 2 ms.

* * * * *